(12) United States Patent
Chung et al.

(10) Patent No.: US 8,899,789 B2
(45) Date of Patent: Dec. 2, 2014

(54) LAMP MODULE

(75) Inventors: Chia-Tin Chung, Miaoli County (TW); Shih-Neng Tai, Taoyuan County (TW)

(73) Assignee: Paragon Semiconductor Lighting Technology Co., Ltd., New Taipei (TW)

( * ) Notice: Subject to any disclaimer, the term of this patent is extended or adjusted under 35 U.S.C. 154(b) by 218 days.

(21) Appl. No.: 13/587,892

(22) Filed: Aug. 16, 2012

(65) Prior Publication Data

US 2013/0088867 A1 Apr. 11, 2013

(30) Foreign Application Priority Data

Oct. 11, 2011 (TW) .............................. 100219001 U

(51) Int. Cl.

| | |
|---|---|
| *F21V 23/06* | (2006.01) |
| *F21V 19/00* | (2006.01) |
| *F21Y 101/02* | (2006.01) |
| *H01L 33/60* | (2010.01) |
| *H01L 25/075* | (2006.01) |
| *F21Y 105/00* | (2006.01) |
| *F21Y 113/00* | (2006.01) |

(52) U.S. Cl.
CPC ........... *F21V 19/003* (2013.01); *F21Y 2101/02* (2013.01); *H01L 33/60* (2013.01); *H01L 25/0753* (2013.01); *F21Y 2105/003* (2013.01); *F21Y 2113/005* (2013.01); *F21V 23/06* (2013.01); *Y10S 362/80* (2013.01)
USPC ...... 362/249.02; 362/255; 362/235; 362/800; 362/297

(58) Field of Classification Search
CPC ..... F21V 19/003; F21V 23/06; H01L 25/075; H01L 33/60
USPC .................................. 362/235, 238, 240, 646
See application file for complete search history.

(56) References Cited

U.S. PATENT DOCUMENTS

| | | | |
|---|---|---|---|
| 7,401,936 B1 * | 7/2008 | Fan ................................. | 362/102 |
| 8,405,118 B2 * | 3/2013 | Chung et al. ..................... | 257/99 |
| 8,421,373 B2 * | 4/2013 | Chung et al. ................... | 315/294 |
| 8,672,517 B2 * | 3/2014 | Chung et al. ................... | 362/294 |
| 8,684,569 B2 * | 4/2014 | Pickard et al. ................. | 362/382 |
| 2008/0158885 A1 * | 7/2008 | Lai et al. ......................... | 362/294 |

* cited by examiner

*Primary Examiner* — Diane Lee
*Assistant Examiner* — Kenny C Sokolowski
(74) *Attorney, Agent, or Firm* — Li&Cai Intellectual Property (USA) Office

(57) ABSTRACT

A lamp module includes a cover structure, a circuit board structure and a multichip package structure, and the circuit board structure and the multichip package structure are sequentially assembled on the bottom side of the cover structure. The cover structure includes a cover body, a plurality of positioning elements disposed on the bottom side of the cover body, and a plurality of retaining elements disposed on the bottom side of the cover body. The cover body has a through opening and a surrounding light-reflecting surface formed on the inner surface of the through opening. The circuit board structure is disposed on the bottom side of the cover body and includes a plurality of conductive pins disposed on the bottom side of the circuit board structure. The multichip package structure is disposed on the bottom side of the cover body and electrically connected to the circuit board structure.

10 Claims, 7 Drawing Sheets

LAMP MODULE

BACKGROUND OF THE INVENTION

1. Field of the Invention

The instant disclosure relates to a micro controller system, and more particularly, to a lamp module without using any external driving circuit.

2. Description of Related Art

The invention of the lamp greatly changed the style of building construction and the living style of human beings, allowing people to work during the night. Traditional lighting devices such as lamps that adopt incandescent bulbs, fluorescent bulbs, or power-saving bulbs have been generally well-developed and used intensively indoor illumination. However, compared to the newly developed light-emitting-diode (LED) lamps, these traditional lamps have the disadvantages of quick attenuation, high power consumption, high heat generation, short working life, high fragility, and being not recyclable. Thus, various LED package structures are created to replace the traditional lighting devices.

SUMMARY OF THE INVENTION

One aspect of the instant disclosure relates to a lamp module without using any external driving circuit.

One of the embodiments of the instant disclosure provides a lamp module, comprising: a cover structure, a circuit board structure and a multichip package structure. The cover structure includes a cover body, a plurality of positioning elements disposed on the bottom side of the cover body, and a plurality of retaining elements disposed on the bottom side of the cover body, wherein the cover body has a through opening and a surrounding light-reflecting surface formed on the inner surface of the through opening. The circuit board structure is disposed on the bottom side of the cover body, wherein the circuit board structure includes a plurality of conductive pins disposed on the bottom side of the circuit board structure. The multichip package structure includes a substrate unit, a light-emitting unit, a frame unit and a package unit, wherein the substrate unit includes a substrate body disposed on the bottom side of the cover body and contacting the bottom side of the cover body and a plurality of conductive pads disposed on the top surface of the substrate body and respectively electrically contacting the conductive pins, the light-emitting unit includes a plurality of LED bare chips disposed on the top surface of the substrate body and exposed by the through opening, the frame unit includes a surrounding light-reflecting resin body surroundingly coated on the top surface of the substrate body and exposed by the through opening, the surrounding light-reflecting resin body surrounds the LED bare chips to form a resin position limiting space on the substrate body, the package unit includes a light-transmitting resin body disposed on the top surface of the substrate body and exposed by the through opening, and the light-transmitting resin body is disposed in the resin position limiting space to cover the LED bare chips.

Another one of the embodiments of the instant disclosure provides a lamp module, comprising: a cover structure, a circuit board structure and a multichip package structure. The cover structure includes a cover body, a plurality of positioning elements disposed on the bottom side of the cover body, and a plurality of retaining elements disposed on the bottom side of the cover body, wherein the cover body has a through opening and a surrounding light-reflecting surface formed on the inner surface of the through opening. The circuit board structure is disposed on the bottom side of the cover body, wherein the circuit board structure includes a plurality of conductive pins disposed on the bottom side of the circuit board structure. The multichip package structure includes a substrate unit, a light-emitting unit, a frame unit and a package unit, wherein the substrate unit includes a substrate body disposed on the bottom side of the cover body and contacting the bottom side of the cover body and a plurality of conductive pads disposed on the top surface of the substrate body and respectively electrically contacting the conductive pins, the light-emitting unit includes a first light-emitting module and a second light-emitting module, the first light-emitting module includes a plurality of first LED bare chips electrically connected to the substrate body and exposed by the through opening, the second light-emitting module includes a plurality of second LED bare chips electrically connected to the substrate body and exposed by the through opening, the frame unit includes a first surrounding light-reflecting resin body and a second surrounding light-reflecting resin body surroundingly coated on the top surface of the substrate body and exposed by the through opening, the first surrounding light-reflecting resin body surrounds the first light-emitting module to form a first resin position limiting space on the substrate body, the second surrounding light-reflecting resin body surrounds the second light-emitting module and the first surrounding light-reflecting resin body to form a second resin position limiting space on the substrate body and between the first surrounding light-reflecting resin body and the second surrounding light-reflecting resin body, the package unit includes a first light-transmitting resin body and a second light-transmitting resin body disposed on the top surface of the substrate body to respectively cover the first light-emitting module and the second light-emitting module, and the first light-transmitting resin body and the second light-transmitting resin body are respectively disposed in the first resin position limiting space and the second resin position limiting space.

Yet another one of the embodiments of the instant disclosure provides a lamp module, comprising: a cover structure, a circuit board structure and a multichip package structure. The cover structure includes a cover body, a plurality of positioning elements disposed on the bottom side of the cover body, and a plurality of retaining elements disposed on the bottom side of the cover body, wherein the cover body has a through opening and a surrounding light-reflecting surface formed on the inner surface of the through opening. The circuit board structure is disposed on the bottom side of the cover body, wherein the circuit board structure includes a plurality of conductive pins disposed on the bottom side of the circuit board structure. The multichip package structure includes a substrate unit, a light-emitting unit, a frame unit and a package unit, wherein the substrate unit includes a substrate body disposed on the bottom side of the cover body and contacting the bottom side of the cover body and a plurality of conductive pads disposed on the top surface of the substrate body and respectively electrically contacting the conductive pins of the circuit board structure.

More precisely, each positioning element has a positioning post extended downwardly from the bottom side of the cover body to abut against the substrate body, and each retaining element has an extending portion extended downwardly from the bottom side of the cover body and a hooking portion extended inwardly from the extending portion to hook the substrate body.

More precisely, each positioning element has at least two reinforcement ribs disposed on the peripheral surface of each corresponding positioning post, and each retaining element has at least one reinforcement portion disposed on the extending portion.

More precisely, the surrounding light-reflecting resin body has a convex junction portion formed thereon, the first surrounding light-reflecting resin body has a convex junction portion formed thereon, and the second surrounding light-reflecting resin body has a convex junction portion formed thereon.

More precisely, the first surrounding light-reflecting resin body and the second surrounding light-reflecting resin body are arranged as concentric circles, the second light-emitting module is disposed between the first surrounding light-reflecting resin body and the second surrounding light-reflecting resin body, and the second light-emitting module surrounds the first surrounding light-reflecting resin body.

More precisely, the multichip package structure further comprises: a current-limiting unit including at least two current-limiting chips disposed on the top surface of the substrate body and electrically connected to the substrate body and separated from the first surrounding light-reflecting resin body by a predetermined distance, wherein the frame unit includes at least two third surrounding resin bodies surroundingly coated on the top surface of the substrate body to respectively surround the at least two current-limiting chips, and the package unit includes at least two opaque resin bodies disposed on the top surface of the substrate body to respectively cover the at least two current-limiting chips, and the at least two opaque resin bodies are respectively surrounded by the at least two third surrounding resin bodies, wherein the first light-emitting module and the second light-emitting module are electrically connected to the substrate body in parallel, the first LED bare chips and one of the at least two current-limiting chips are electrically connected with each other in series, and the second LED bare chips and the other current-limiting chip are electrically connected with each other in series.

Therefore, the circuit board structure and the multichip package structure can be sequentially assembled on the bottom side of the cover structure, thus the lamp module can be assembled as a single module without using any external driving circuit.

To further understand the techniques, means and effects of the instant disclosure applied for achieving the prescribed objectives, the following detailed descriptions and appended drawings are hereby referred, such that, through which, the purposes, features and aspects of the instant disclosure can be thoroughly and concretely appreciated. However, the appended drawings are provided solely for reference and illustration, without any intention to limit the instant disclosure.

DETAILED DESCRIPTION OF THE PREFERRED EMBODIMENTS

First Embodiment

Referring to FIG. 1A to FIG. 1E, where the first embodiment of the instant disclosure provides a lamp module, comprising: a cover structure C, a circuit board structure P and a multichip package structure M.

Figure 1A:
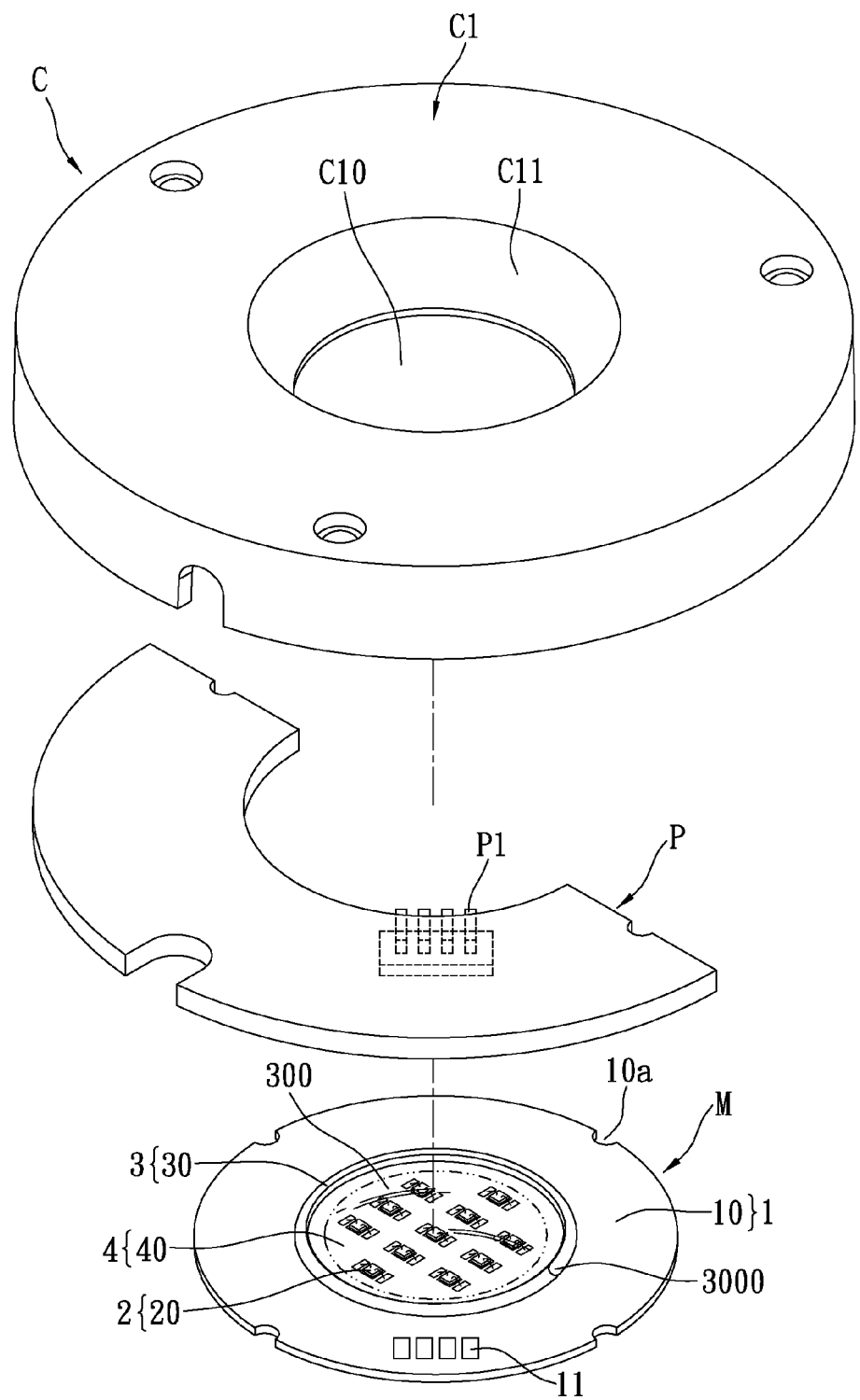
FIG. 1A shows a perspective, exploded, schematic view of the lamp module according to the first embodiment of the instant disclosure.
Figure 1B:
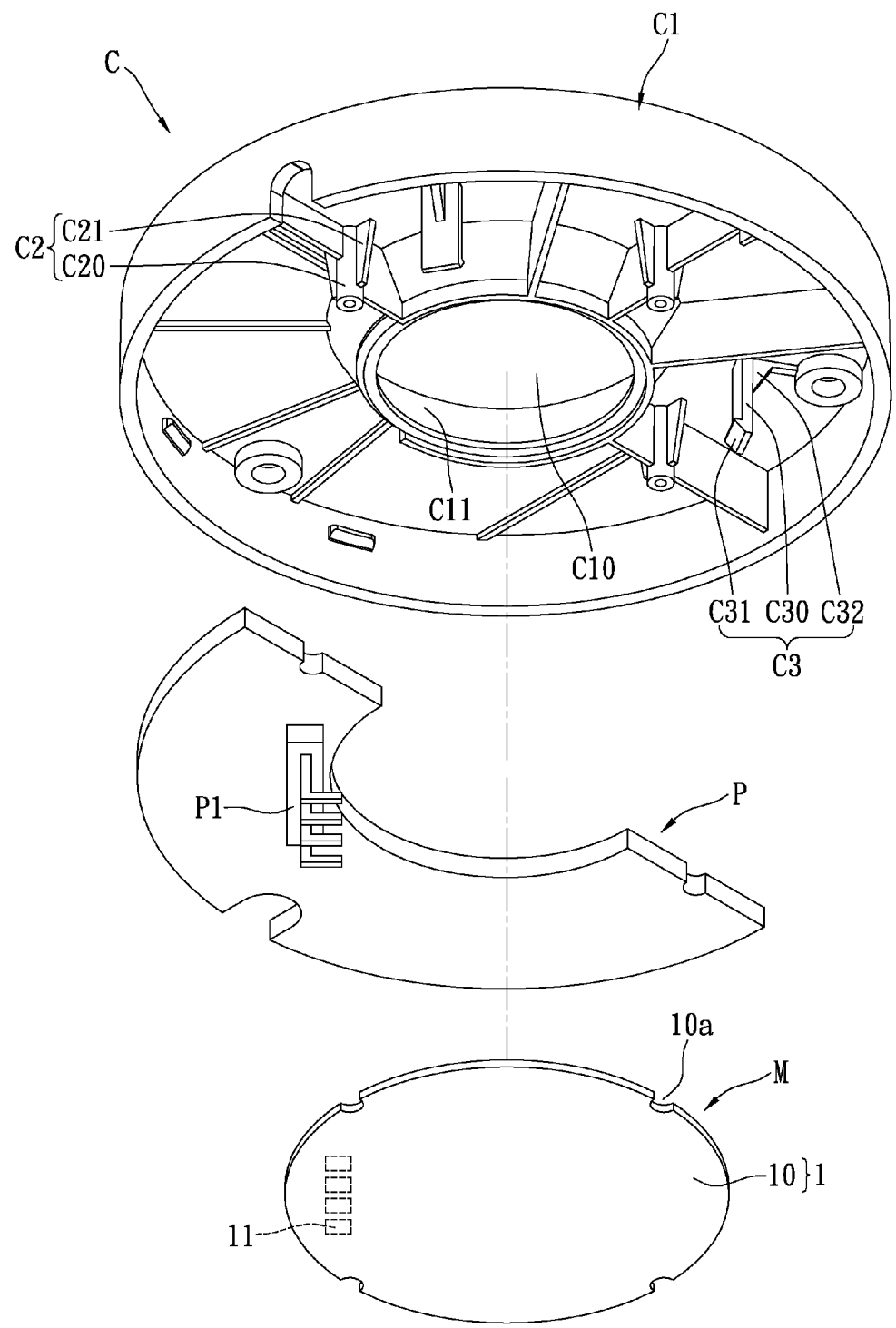
FIG. 1B shows another perspective, exploded, schematic view of the lamp module according to the first embodiment of the instant disclosure.

First, referring to FIG. 1A and FIG. 1B, the cover structure C includes a cover body C1, a plurality of positioning elements C2 disposed on the bottom side of the cover body C1, and a plurality of retaining elements C3 disposed on the bottom side of the cover body C1, and the cover body C1 has a through opening C10 and a surrounding light-reflecting surface C11 formed on the inner surface of the through opening C10. The circuit board structure P is disposed on the bottom side of the cover body C1, and the circuit board structure P includes a plurality of conductive pins P1 disposed on the bottom side of the circuit board structure P. The multichip package structure M includes a substrate unit 1, a light-emitting unit 2, a frame unit 3 and a package unit 4.

Figure 1C:
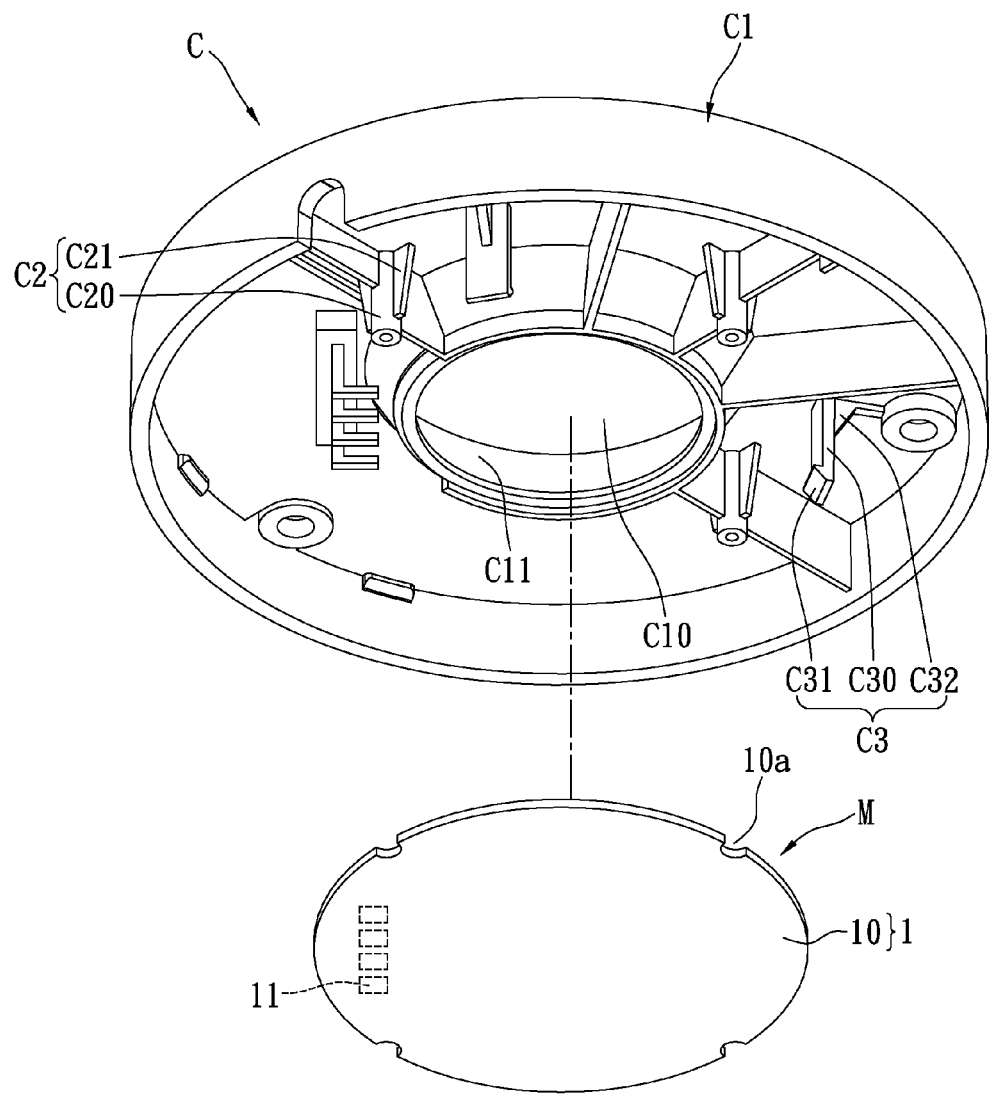
FIG. 1C shows a partial, perspective, exploded, schematic view of the lamp module according to the first embodiment of the instant disclosure.
Figure 1D:
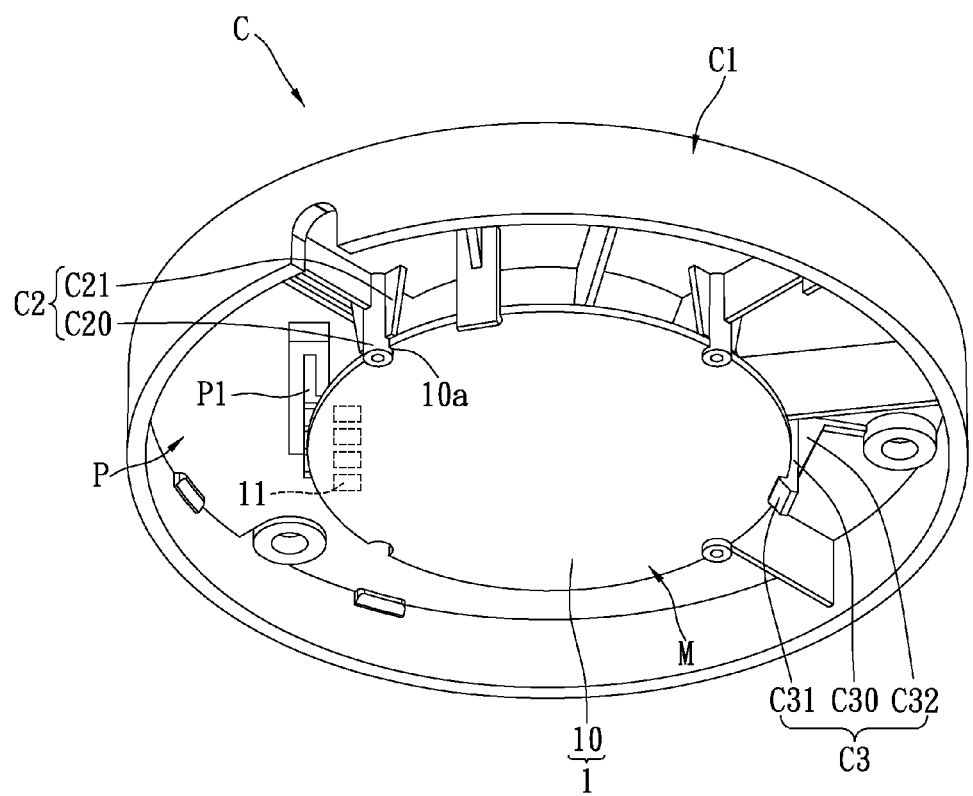
FIG. 1D shows a perspective, assembled, schematic view of the lamp module according to the first embodiment of the instant disclosure.

Moreover, the substrate unit 1 includes a substrate body 10 disposed on the bottom side of the cover body C1 to contact the bottom side of the cover body C1 and a plurality of conductive pads 11 disposed on the top surface of the substrate body 10 and respectively electrically contacting the conductive pins P11 (as shown in FIG. 1D). The light-emitting unit 2 includes a plurality of LED bare chips 20 disposed on the top surface of the substrate body 10 to electrically connect to the substrate body 10 by wire-bonding method and exposed by the through opening C10. The frame unit 3 includes a surrounding light-reflecting resin body 30 (such as a resin dam) surroundingly coated on the top surface of the substrate body 10 and exposed by the through opening C10, and the surrounding light-reflecting resin body 30 can surround the LED bare chips 20 to form a resin position limiting space 300 on the substrate body 10. The package unit 4 includes a light-transmitting resin body 40 disposed on the top surface of the substrate body 10 and exposed by the through opening C10, and the light-transmitting resin body 40 is disposed in the resin position limiting space 300 to cover the LED bare chips 20.

More precisely, each positioning element C2 has a positioning post C20 extended downwardly from the bottom side of the cover body C1 to abut against the substrate body 10. For example, the substrate body 10 has a plurality of notches 10a formed on the peripheral surface of the substrate body 10, and the positioning post C20 of each positioning element C2 can pass through each corresponding notch 10a and be positioned in each corresponding notch 10a (as shown in FIG. 1D). Each positioning element C2 has at least two reinforcement ribs C21 disposed on the peripheral surface of each corresponding positioning post C20 for increasing the structure strength of each positioning element C2. In addition, each retaining element C3 has an extending portion C30 extended downwardly from the bottom side of the cover body C1 and a hooking portion C31 extended inwardly from the extending portion C30 to hook the substrate body 10 (as shown in FIG. 1D), and each retaining element C3 has at least one reinforcement portion C32 disposed on the extending portion C30 for increasing the structure strength of each retaining element C30. Moreover, the surrounding light-reflecting resin body 30 has a convex junction portion 3000 (or a concave junction portion) formed thereon. In other words, when the first surrounding light-reflecting resin body 30 is about to be finished by surrounding coating, the convex or concave junction portion 3000 is formed naturally on the first surrounding light-reflecting resin body 30.

Figure 1E:
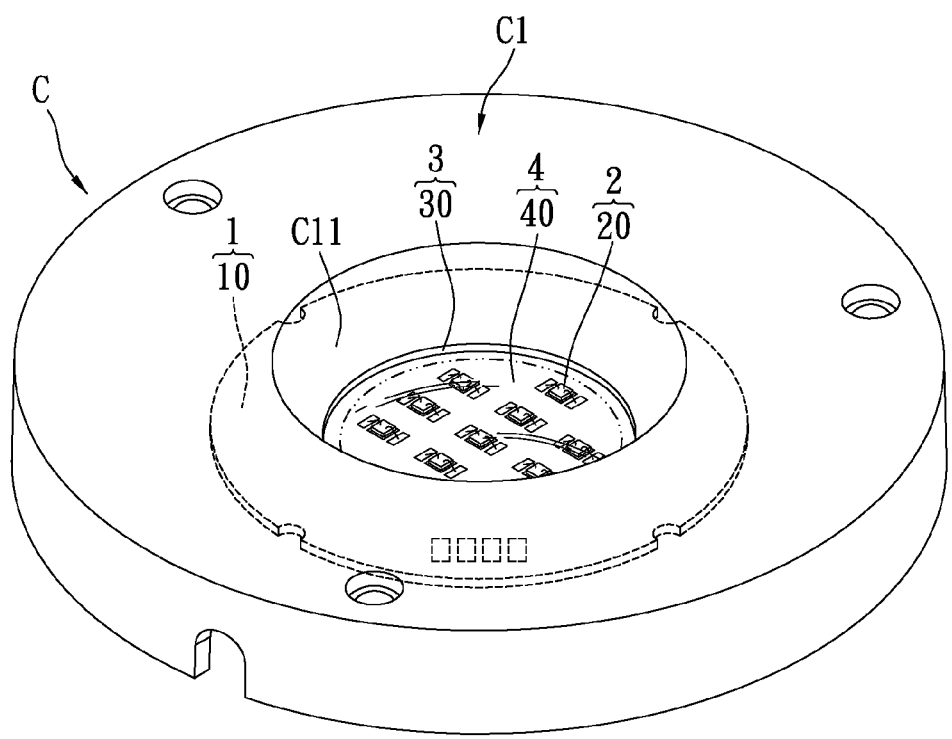
FIG. 1E shows another perspective, assembled, schematic view of the lamp module according to the first embodiment of the instant disclosure.

Furthermore, referring to FIG. 1C to FIG. 1E, when the circuit board structure P and the multichip package structure M are sequentially assembled on the bottom side of the cover structure C, the surrounding light-reflecting resin body 30 can be exposed by the through opening C10, thus light beams generated by the multichip package structure M can be condensed through the surrounding light-reflecting surface C11 of the cover body C1. In addition, the multichip package structure M can electrically contact the circuit board structure P having a plurality of circuits or function chips such as a bridge rectifier, thus the lamp module can be used through AC current.

Second Embodiment

Referring to FIG. 2A to FIG. 2D, where the second embodiment of the instant disclosure provides a lamp module. The difference between the second embodiment and the first embodiment is as follows: in the second embodiment, the multichip package structure M includes a substrate unit 1, a light-emitting unit 2, a frame unit 3 and a package unit 4.

The substrate body 10 includes a circuit substrate 100, a heat dissipating layer 101 disposed on the bottom surface of the circuit substrate 100, a plurality of conductive pads 102 disposed on the top surface of the circuit substrate 100, and an insulating layer 103 disposed on the top surface of the circuit substrate 100 to expose the conductive pads 102. Hence, the heat dissipating efficiency of the circuit substrate 100 can be increased by using the heat dissipating layer 101, and the insulating layer 103 may be a solder mask for only exposing the conductive pads 102 in order to achieve local soldering.

In addition, the light-emitting unit 2 includes a first light-emitting module 2a (such as for generating red light) and a second light-emitting module 2b (such as for generating blue light). The first light-emitting module 2a includes a plurality of first LED bare chips 20a (such as red LED bare chip without packaging) electrically connected to the substrate body 10 and exposed by the through opening C10, and the second light-emitting module 2b includes a plurality of second LED bare chips 20b (such as blue LED bare chip without packaging) electrically connected to the substrate body 10 and exposed by the through opening C10. In other words, the designer can plan at least two predetermined chip-placing regions on the substrate body 10 in advance, thus the red LED bare chips and the blue LED bare chips can be respectively placed on the two chip-placing regions by wire bonding.

Moreover, the frame unit 3 includes a first surrounding light-reflecting resin body 30a and a second surrounding light-reflecting resin body 30b surroundingly coated on the top surface of the substrate body 10 and exposed by the through opening C10. The first surrounding light-reflecting resin body 30a surrounds the first light-emitting module 2a to form a first resin position limiting space 300a on the substrate body 10, and the second surrounding light-reflecting resin body 30b surrounds the second light-emitting module 2b and the first surrounding light-reflecting resin body 30a to form a second resin position limiting space 300b on the substrate body 10 and between the first surrounding light-reflecting resin body 30a and the second surrounding light-reflecting resin body 30b.

More precisely, the first surrounding light-reflecting resin body 30a has a convex or concave junction portion 3000, and the second surrounding light-reflecting resin body 30b has a convex or concave junction portion 3000. In other words, when the first surrounding light-reflecting resin body 30a or the second surrounding light-reflecting resin body 30b is about to be finished by surrounding coating, the convex or concave junction portion 3000 is formed naturally on the first surrounding light-reflecting resin body 30a or the second surrounding light-reflecting resin body 30b. In addition, the first or second surrounding light-reflecting resin body (30a or 30b) has an arc shape formed on the top surface thereof, the first or second surrounding light-reflecting resin body (30a or 30b) has a radius tangent T and the angle θ of the radius tangent T relative to the top surface of the substrate body 10 may be between 40° and 50°, the maximum height H of the first or second surrounding light-reflecting resin body (30a or 30b) relative to the top surface of the substrate body 10 may be between 0.3 mm and 0.7 mm, the width W of the bottom side of the first or second surrounding light-reflecting resin body (30a or 30b) may be between 1.5 mm and 3 mm, the thixotropic index of the first or second surrounding light-reflecting resin body (30a or 30b) may be between 4 and 6, and the first or second surrounding light-reflecting resin body (30a or 30b) may be formed by mixing inorganic additive with white thermohardening resin.

Figure 2A:
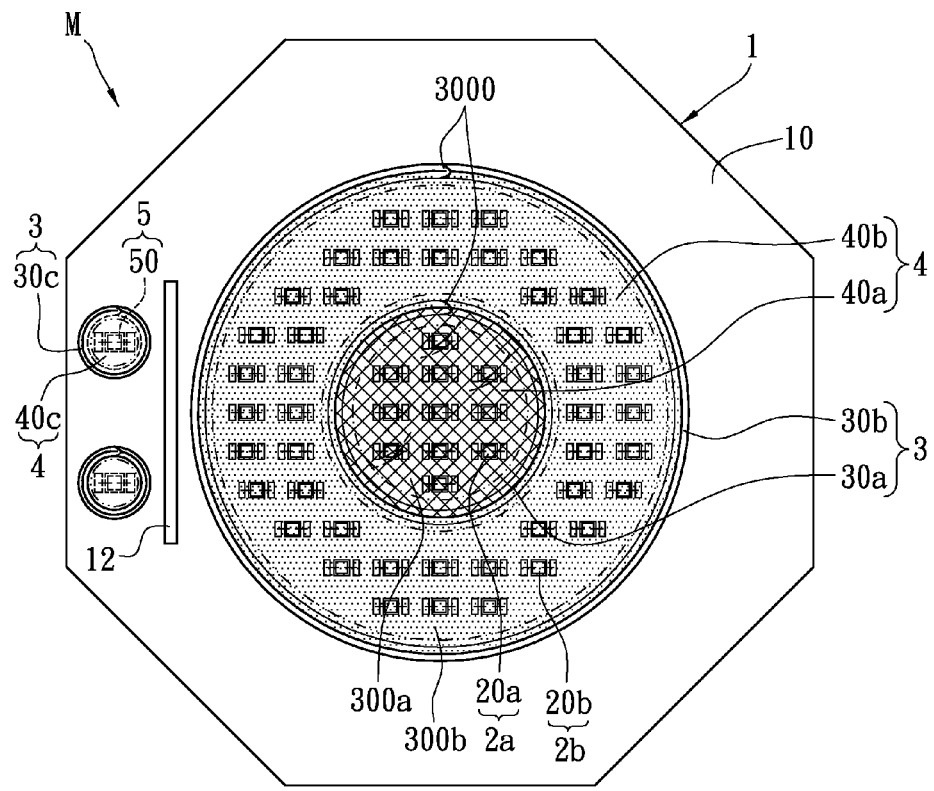
FIG. 2A shows a top, schematic view of the multichip package structure of the lamp module according to the second embodiment of the instant disclosure.
Figure 2B:
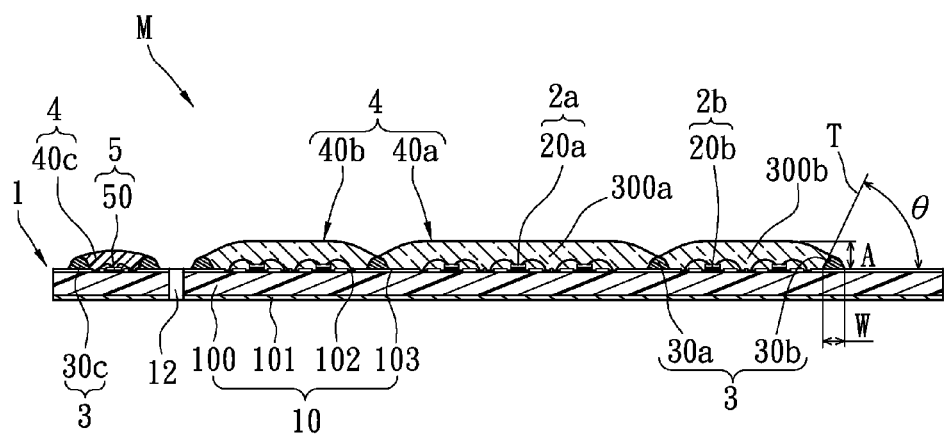
FIG. 2B shows a lateral, cross-sectional, schematic view of the multichip package structure of the lamp module according to the second embodiment of the instant disclosure.

Furthermore, the package unit 4 includes a first light-transmitting resin body 40a (such as a transparent resin) and a second light-transmitting resin body 40b (such as a phosphor resin) disposed on the top surface of the substrate body 10 to respectively cover the first light-emitting module 2a and the second light-emitting module 2b, and the first light-transmitting resin body 40a and the second light-transmitting resin body 40b are respectively disposed in the first resin position limiting space 300a and the second resin position limiting space 300b. More precisely, the first surrounding light-reflecting resin body 30a and the second surrounding light-reflecting resin body 30b can be arranged as concentric circles, the second light-emitting module 2b is disposed between the first surrounding light-reflecting resin body 30a and the second surrounding light-reflecting resin body 30b, and the second light-emitting module 2b surrounds the first surrounding light-reflecting resin body 30a (as shown in FIG. 2A).

More precisely, when the red light source generated by matching the red LED bare chips and the transparent resin and the white light source generated by matching the blue LED bare chips and the phosphor resin are mixed with each other, the color render index of the multichip package structure M can be increased.

In addition, the multichip package structure M further comprises a current-limiting unit 5 including at least two current-limiting chips 50 disposed on the top surface of the substrate body 10 and electrically connected to the substrate body 10 (such as by wire bonding) and separated from the first surrounding light-reflecting resin body 30b by a predetermined distance. Moreover, the frame unit 3 includes at least two third surrounding resin bodies 30c surroundingly coated on the top surface of the substrate body 10 to respectively surround the at least two current-limiting chips 50. The method of making the two third surrounding resin bodies 30c is the same as that of making the first or second surrounding light-reflecting resin body (30a, 30b). Of course, the two third surrounding resin bodies 30c can be combined to form single third surrounding resin body 30c for concurrently surrounding the two current-limiting chips 50. Furthermore, the package unit 4 includes at least two opaque resin bodies 40c disposed on the top surface of the substrate body 10 to respectively cover the at least two current-limiting chips 50, and the at least two opaque resin bodies 40c are respectively surrounded by the at least two third surrounding resin bodies 30c, thus the two opaque resin bodies 40c can prevent the two current-limiting chips 50 from being damaged or affected by lighting of the first LED bare chips 20a and the second LED bare chips 20b.

Furthermore, the substrate unit 1 includes at least one heat-insulating slot 12 passing through the substrate body 10, and the heat-insulating slot 12 can be formed between the light-emitting unit (the first light-emitting module 2a and the second light-emitting module 2b) and the current-limiting unit 5 or between the second surrounding light-reflecting resin body 30b and the third surrounding resin body 30c. Therefore, the heat transmitting path between the light-emitting unit and the current-limiting unit 5 can be effectively reduced by using the heat-insulating slot 12, thus the velocity of transmitting the heat generated by the current-limiting chip 50 to the light-emitting unit can be effectively decreased.

Figure 2C:
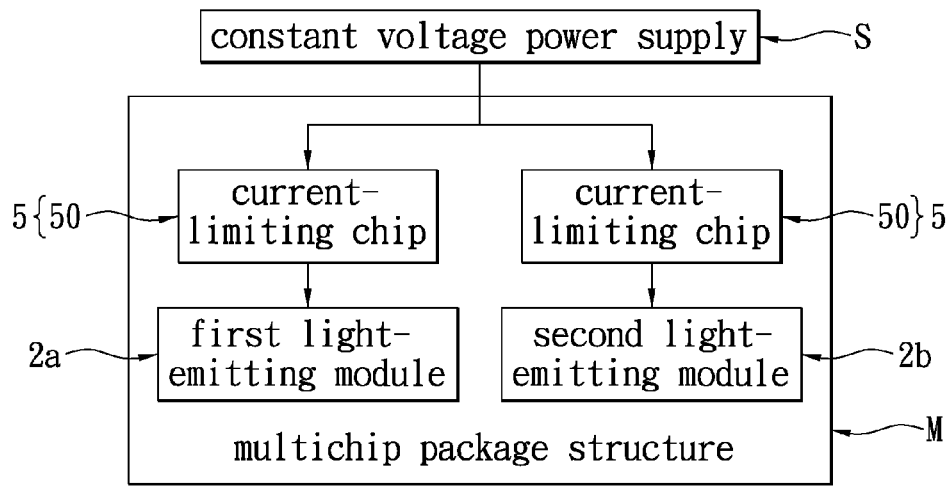
FIG. 2C shows a function block diagram of the multichip package structure of the lamp module according to the second embodiment of the instant disclosure.
Figure 2D:
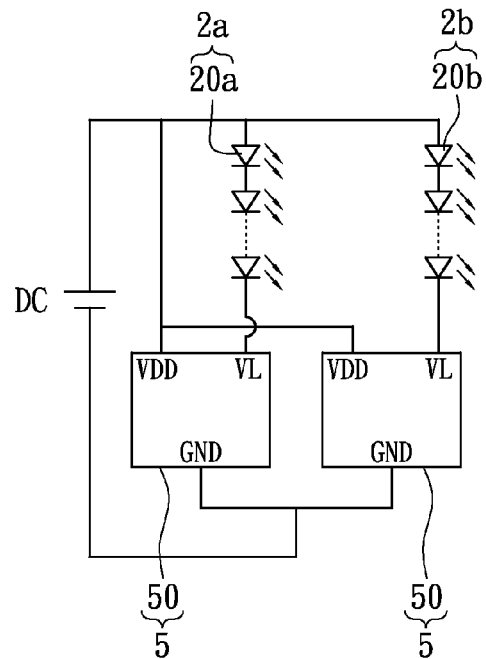
FIG. 2D shows a circuit, schematic view of the multichip package structure of the lamp module according to the second embodiment of the instant disclosure.

Referring to FIGS. 2C and 2D, the first light-emitting module 2a and the second light-emitting module 2b may be electrically connected to the substrate body 10 in parallel. The first LED bare chips 20a and one of the two current-limiting chips 50 may be electrically connected with each other in series, and the second LED bare chips 20b and the other current-limiting chip 50 may be electrically connected with each other in series. In addition, the current-limiting chip 50 is electrically connected between the constant voltage power supply S and the first light-emitting module 2a and between the constant voltage power supply S and the second light-emitting module 2b, thus the light-emitting unit can obtain constant voltage from the constant voltage power supply S through the current-limiting chip 50.

Of course, the first LED bare chips 20a can be electrically connected with each other in parallel to form a parallel red LED bare chip group, the second LED bare chips 20b can be divided into a plurality of parallel blue LED bare chip groups, and the parallel red LED bare chip group and the parallel blue LED bare chip groups can be electrically connected with each other in series. In addition, the first LED bare chips 20a can be lighted up simultaneously or sectionally, and the second LED bare chips 20b can be lighted up simultaneously or sectionally.

In conclusion, the circuit board structure and the multichip package structure can be sequentially assembled on the bottom side of the cover structure, thus the lamp module can be assembled as a single module without using any external driving circuit.

The above-mentioned descriptions merely represent the preferred embodiments of the instant disclosure, without any intention or ability to limit the scope of the instant disclosure which is fully described only within the following claims Various equivalent changes, alterations or modifications based on the claims of instant disclosure are all, consequently, viewed as being embraced by the scope of the instant disclosure.

What is claimed is:

1. A lamp module, comprising:
a cover structure including a cover body, a plurality of positioning elements disposed on the bottom side of the cover body, and a plurality of retaining elements disposed on the bottom side of the cover body, wherein the cover body has a through opening and a surrounding light-reflecting surface formed on the inner surface of the through opening;
a circuit board structure disposed on the bottom side of the cover body, wherein the circuit board structure includes a plurality of conductive pins disposed on the bottom side of the circuit board structure; and
a multichip package structure including a substrate unit, a light-emitting unit, a frame unit and a package unit, wherein the substrate unit includes a substrate body disposed on the bottom side of the cover body and contacting the bottom side of the cover body and a plurality of conductive pads disposed on the top surface of the substrate body and respectively electrically contacting the conductive pins, the light-emitting unit includes a plurality of LED bare chips disposed on the top surface of the substrate body and exposed by the through opening, the frame unit includes a surrounding light-reflecting resin body surroundingly coated on the top surface of the substrate body and exposed by the through opening, the surrounding light-reflecting resin body surrounds the LED bare chips to form a resin position limiting space on the substrate body, the package unit includes a light-transmitting resin body disposed on the top surface of the substrate body and exposed by the through opening, and the light-transmitting resin body is disposed in the resin position limiting space to cover the LED bare chips.

2. The lamp module of claim 1, wherein each positioning element has a positioning post extended downwardly from the bottom side of the cover body to abut against the substrate body, and each retaining element has an extending portion extended downwardly from the bottom side of the cover body and a hooking portion extended inwardly from the extending portion to hook the substrate body.

3. The lamp module of claim 2, wherein each positioning element has at least two reinforcement ribs disposed on the peripheral surface of each corresponding positioning post, and each retaining element has at least one reinforcement portion disposed on the extending portion.

4. The lamp module of claim 1, wherein the surrounding light-reflecting resin body has a convex junction portion formed thereon.

5. A lamp module, comprising:
a cover structure including a cover body, a plurality of positioning elements disposed on the bottom side of the cover body, and a plurality of retaining elements disposed on the bottom side of the cover body, wherein the cover body has a through opening and a surrounding light-reflecting surface formed on the inner surface of the through opening;
a circuit board structure disposed on the bottom side of the cover body, wherein the circuit board structure includes a plurality of conductive pins disposed on the bottom side of the circuit board structure; and
a multichip package structure including a substrate unit, a light-emitting unit, a frame unit and a package unit, wherein the substrate unit includes a substrate body disposed on the bottom side of the cover body and contacting the bottom side of the cover body and a plurality of conductive pads disposed on the top surface of the substrate body and respectively electrically contacting the conductive pins, the light-emitting unit includes a first light-emitting module and a second light-emitting module, the first light-emitting module includes a plurality of first LED bare chips electrically connected to the substrate body and exposed by the through opening, the second light-emitting module includes a plurality of second LED bare chips electrically connected to the substrate body and exposed by the through opening, the frame unit includes a first surrounding light-reflecting resin body and a second surrounding light-reflecting resin body surroundingly coated on the top surface of the substrate body and exposed by the through opening, the first surrounding light-reflecting resin body surrounds the first light-emitting module to form a first resin position limiting space on the substrate body, the second surrounding light-reflecting resin body surrounds the second light-emitting module and the first surrounding light-reflecting resin body to form a second resin position limiting space on the substrate body and between the first surrounding light-reflecting resin body and the second surrounding light-reflecting resin body, the package unit includes a first light-transmitting resin body and a second light-transmitting resin body disposed on the top surface of the substrate body to respectively cover the first light-emitting module and the second light-emitting module, and the first light-transmitting resin body and the second light-transmitting resin body are respectively disposed in the first resin position limiting space and the second resin position limiting space.

6. The lamp module of claim 5, wherein each positioning element has a positioning post extended downwardly from the bottom side of the cover body to abut against the substrate body, and each retaining element has an extending portion extended downwardly from the bottom side of the cover body and a hooking portion extended inwardly from the extending portion to hook the substrate body.

7. The lamp module of claim 6, wherein each positioning element has at least two reinforcement ribs disposed on the peripheral surface of each corresponding positioning post, and each retaining element has at least one reinforcement portion disposed on the extending portion.

8. The lamp module of claim 5, wherein the first surrounding light-reflecting resin body has a convex junction portion formed thereon, and the second surrounding light-reflecting resin body has a convex junction portion formed thereon.

9. The lamp module of claim 5, wherein the first surrounding light-reflecting resin body and the second surrounding light-reflecting resin body are arranged as concentric circles, the second light-emitting module is disposed between the first surrounding light-reflecting resin body and the second surrounding light-reflecting resin body, and the second light-emitting module surrounds the first surrounding light-reflecting resin body.

10. The lamp module of claim 5, where the multichip package structure further comprises: a current-limiting unit including at least two current-limiting chips disposed on the top surface of the substrate body and electrically connected to the substrate body and separated from the first surrounding light-reflecting resin body by a predetermined distance, wherein the frame unit includes at least two third surrounding resin bodies surroundingly coated on the top surface of the substrate body to respectively surround the at least two current-limiting chips, and the package unit includes at least two opaque resin bodies disposed on the top surface of the substrate body to respectively cover the at least two current-limiting chips, and the at least two opaque resin bodies are respectively surrounded by the at least two third surrounding resin bodies, wherein the first light-emitting module and the second light-emitting module are electrically connected to the substrate body in parallel, the first LED bare chips and one of the at least two current-limiting chips are electrically connected with each other in series, and the second LED bare chips and the other current-limiting chip are electrically connected with each other in series.

* * * * *